United States Patent
Khan et al.

(10) Patent No.: US 12,185,515 B2
(45) Date of Patent: Dec. 31, 2024

(54) POLYMER-GRAPHENE ELECTRONIC COMPONENT HOUSING

(71) Applicant: Aisin Technical Center of America, Inc., Northville, MI (US)

(72) Inventors: Saida Khan, Canton, MI (US); Santosh Sarang, Novi, MI (US); Masahiro Narita, Novi, MI (US)

(73) Assignee: Aisin Technical Center of America, Inc., Northville, MI (US)

( * ) Notice: Subject to any disclaimer, the term of this patent is extended or adjusted under 35 U.S.C. 154(b) by 0 days.

(21) Appl. No.: 17/874,938

(22) Filed: Jul. 27, 2022

(65) Prior Publication Data

US 2023/0200034 A1    Jun. 22, 2023

Related U.S. Application Data

(60) Provisional application No. 63/290,139, filed on Dec. 16, 2021.

(51) Int. Cl.
| | |
|---|---|
| *H05K 9/00* | (2006.01) |
| *B32B 7/025* | (2019.01) |
| *B32B 27/08* | (2006.01) |
| *B32B 27/20* | (2006.01) |
| *B32B 27/32* | (2006.01) |

(52) U.S. Cl.
CPC ........... *H05K 9/0045* (2013.01); *B32B 7/025* (2019.01); *B32B 27/08* (2013.01); *B32B 27/20* (2013.01); *B32B 27/32* (2013.01); *H05K 9/0079* (2013.01); *H05K 9/0083* (2013.01);
(Continued)

(58) Field of Classification Search
CPC ........................... H05K 9/0079; H05K 9/0045
See application file for complete search history.

(56) References Cited

U.S. PATENT DOCUMENTS

| | | |
|---|---|---|
| 8,324,515 B2 | 12/2012 | Stevenson et al. |
| 9,174,413 B2 | 11/2015 | Avouris et al. |
(Continued)

FOREIGN PATENT DOCUMENTS

| | | |
|---|---|---|
| JP | 06275741 A | 9/1994 |
| WO | 2015199624 A1 | 12/2015 |
| WO | 2021001298 A1 | 1/2021 |

OTHER PUBLICATIONS

Jia et al., "Graphene Foams for Electromagnetic Interference Shielding: A Review," ACS Appl. Nano Mater., 3, 7, Jun. 24, 2020, https://doi.org/10.1021/acsanm.0c00835, pp. 6140-6155 (41 pages).
(Continued)

*Primary Examiner* — Hung V Ngo
(74) *Attorney, Agent, or Firm* — Christopher G. Darrow; Darrow Mustafa PC (57) ABSTRACT

An electronic component housing defining an EMI shield and an ESD protection cover includes a polymeric core formed from a first polymeric material with a reinforcement material and an overmolded outer layer formed from a second polymeric material with between about 2 wt. % and about 30 wt. % graphene. The reinforcement material provides structural reinforcement to the electronic component housing and is at least one of carbon fiber, glass, talc, mineral filler, and combinations thereof, the overmolded outer layer defines a housing skin disposed on the polymeric core.

20 Claims, 4 Drawing Sheets

(52) U.S. Cl.
CPC ..... *B32B 2250/02* (2013.01); *B32B 2250/242* (2013.01); *B32B 2307/212* (2013.01); *B32B 2457/00* (2013.01)

(56) References Cited

U.S. PATENT DOCUMENTS

| | | | |
|---|---|---|---|
| 9,901,018 | B1 | 2/2018 | Richmond et al. |
| 11,006,554 | B1 | 5/2021 | Su |
| 2009/0117386 | A1 | 5/2009 | Vacanti et al. |
| 2012/0142832 | A1 | 6/2012 | Varma et al. |
| 2013/0333937 | A1* | 12/2013 | Avouris ............... H05K 9/0081 174/394 |
| 2014/0008119 | A1 | 1/2014 | Brandt |
| 2015/0337105 | A1 | 11/2015 | Takahashi et al. |
| 2016/0303838 | A1 | 10/2016 | Chen et al. |
| 2017/0043562 | A1 | 2/2017 | Chatzi et al. |
| 2018/0072863 | A1 | 3/2018 | Scheffer et al. |
| 2018/0338394 | A1* | 11/2018 | OBarske ............... B33Y 10/00 |
| 2018/0346679 | A1 | 12/2018 | Shishkin et al. |
| 2021/0385983 | A1* | 12/2021 | Wu ...................... H05K 9/0084 |

OTHER PUBLICATIONS

Zhao et al., "Flexible PEBAX/graphene electromagnetic shielding composite films with a negative pressure effect of resistance for pressure sensors applications,": RSC Adv., 10, Jan. 8, 2020, pp. 1535-1543 (9 pages).

Kargar et al., "Dual-Functional Graphene Composites for Electromagnetic Shielding and Thermal Management," Adv. Electron. Mater. 2019, 5, 1800558, Oct. 29, 2018, pp. 1-9 (9 pages).

Cao et al., "Graphene nanohybrids: excellent electromagnetic properties for the absorbing and shielding of electromagnetic waves," J.Mater. Chem. C, 6, 2018-05-07, pp. 4586-4602 (18 pages).

Khodiri et al., "Novel hybrid nanocomposites based on polyvinyl alcohol/graphene/magnetite nanoparticles for high electromagnetic shielding performance," Journal of Alloys and Compounds, vol. 847, 156430, Dec. 20, 2020, pp. 1-12 (12 pages).

Barani et al., "Multifunctional Graphene Composites for Electromagnetic Shielding and Thermal Management at Elevated Temperatures," Advanced Electronic Materials, Sep. 13, 2020, pp. 1-12 (12 pages).

Song et al., "Flexible graphene/polymer composite films in sandwich structures for effective electromagnetic Interference shielding," Carbon, vol. 66, Jan. 2014, pp. 67-76 (10 pages).

Chen et al., "Recent advances in graphene-based films for electromagnetic interference shielding: Review and future prospects," Carbon, vol. 180, Aug. 15, 2021, pp. 163-184 (22 pages).

Wang et al., "Effects of upgrading temperature on electromagnetic shielding properties of three-dimensional graphene/SiBCN/SiC ceramic composites," Ceramics International, vol. 45, Issue 17, Pat A, Dec. 1, 2019, pp. 21278-21285 (8 pages).

Wang et al., "Three-dimensional graphene/SiBCN composites for high-performance electromagnetic interference shielding," Ceramics International, vol. 44, Issue 18, Dec. 15, 2018, pp. 22830-22839 (10 pages).

D'Aloia et al., "Synthesis and characterization of graphene-based nanocomposites for EM shielding applications," 2013 International Symposium on Electromagnetic Compatibility, Nov. 7, 2013, pp. 587-592, (6 pages).

\* cited by examiner

POLYMER-GRAPHENE ELECTRONIC COMPONENT HOUSING

CROSS REFERENCE TO RELATED APPLICATIONS

This application claims benefit of U.S. Provisional Application No. 63/290,139 filed on Dec. 16, 2021, which is herein incorporated by reference in its entirety.

TECHNICAL FIELD

The present disclosure relates generally to polymeric component housings and, more particularly, to polymeric component housings for electronic devices.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Electronic circuitry of electronic devices such as electric motors, electric powertrains, radar sensors, vehicle speed sensors, electric locks, radios, consoles, among others, emit electromagnetic (EM) radiation. In addition, such EM radiation can interfere with other electronic devices, e.g., an electronic control unit (ECU), in proximity to an EM radiation emitting electronic device. The EM radiation interference is known as Electromagnetic Interference (EMI) and EMI shields are used to attenuate EM radiation by reflection and/or absorption. Electronic devices may also require dissipation of static charges or protection from electrostatic discharge (ESD) due to static build up.

Traditional protection strategies from EMI and ESD include conductive metallic housings, polymer housings with electro-less or electro-plated metal coatings, polymer housings with conductive spray coatings, and polymer housings with metallization coatings (e.g., vacuum deposited or sputtered coatings). However, conductive metallic housings can have weight, size, and design flexibility limitations, polymer housings with electro-less metal, electro-plated metal or metallization coatings can have environmental health & safety (EHS) and waste disposal limitations, and polymer housings with conductive spray coatings can have coating adhesion limitations.

The present disclosure addresses issues related to EMI and ESD housings, and other issues related to EMI shielding and ESD protection.

SUMMARY

This section provides a general summary of the disclosure and is not a comprehensive disclosure of its full scope or all its features.

In one form of the present disclosure, an electronic component housing with a polymeric core and an overmolded outer layer is provided. The polymeric core is formed from a first polymeric material and the overmolded outer layer is formed from a second polymeric material with graphene. Also, the overmolded outer layer defines a housing skin disposed on the polymeric core.

In another form of the present disclosure, an electronic component housing defining an EMI shield and an ESD protection cover includes a polymeric core formed from a first polymeric material with a reinforcement material and an overmolded outer layer formed from a second polymeric material and between about 2 wt. % and about 30 wt. % graphene. The reinforcement material provides structural reinforcement to the electronic component housing and is at least one of carbon fiber, glass, talc, mineral filler, and combinations thereof, and the overmolded outer layer defines a housing skin disposed on the polymeric core.

In still another form of the present disclosure, a method of manufacturing an electronic component housing defining an EMI shield and an ESD protection cover includes injection molding a first polymeric material with a reinforcement material and forming a polymeric core using a two shot injection molding machine, and injection molding a second polymeric material with between about 2 wt. % and about 30 wt. % graphene and forming an overmolded outer layer defining a housing skin on the polymeric core using the two shot injection molding machine. The reinforcement material is at least one of carbon fiber, glass, talc, mineral filler, and combinations thereof, and provides structural reinforcement to the electronic component housing. Also, the polymeric core has a thickness between about 1 mm and about 10 mm, the housing skin has a thickness between about 0.5 mm and about 5 mm, the polymeric core with the housing skin has a shielding efficiency between about 35 dB and about 90 dB for EM radiation frequencies between about 1 GHz to about 40 GHz, and/or the polymeric core with the housing skin has an anti-static conductivity greater than about $10^{-10}$ S/m and less than or equal to about $10^{-6}$ S/m, and/or a static dissipative conductivity greater than about $10^{-8}$ S/m and less than or equal to about $10^{-3}$ S/m.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

DETAILED DESCRIPTION

The present disclosure provides an electronic component housing (also referred to herein simply as "housing") with a polymeric core (also referred to herein or known as a "polymeric layer" and/or a "polymeric substrate") and an overmolded outer layer defining a housing skin disposed on the polymeric core. The polymeric core can be formed from a first polymeric material with additions of a reinforcement material, the overmolded outer layer can be formed from a second polymeric material with additions of graphene and/or carbon black, and the housing provides EMI shielding and/or ESD protection for an electronic device. For example, the housing provides EMI shielding and/or ESD protection for an ECU contained at least partially within the housing and located in proximity to other electronic devices emitting EM radiation. In this manner, a lightweight EMI shield and/or ESD protection cover for one or more ECUs of a vehicle is provided.

In some variations of the present disclosure, two shot injection molding or overmolding a graphene and/or carbon black rich conductive polymeric layer onto a polymeric core is used to form the housing, and the housing overcomes the issues of traditional shielding solutions. For example, the housing is lightweight compared to metal or metal fiber reinforced polymer housings and is manufactured via the high volume two-shot molding process such that secondary operations such as joining, welding, etc., can be eliminated. Adhesion and durability issues can also be eliminated by using the same base resin system for the polymeric core and the housing skin. And injection molding is suitable for complex geometries and offers freedom of designing parts with different graphene and/or carbon black densities and/or wall thicknesses for optimized performance.

Additional benefits of other functionalities of graphene and/or carbon black such as heat resistance, UV resistance, friction resistance, and wear resistance, as well as flame retardancy, can be achieved in addition to EMI shielding and/or ESD protection. In some variations, graphene and/or carbon black is included only in the housing skin and thereby reduces cost of using a conductive filler in the housing.

Figure 1:
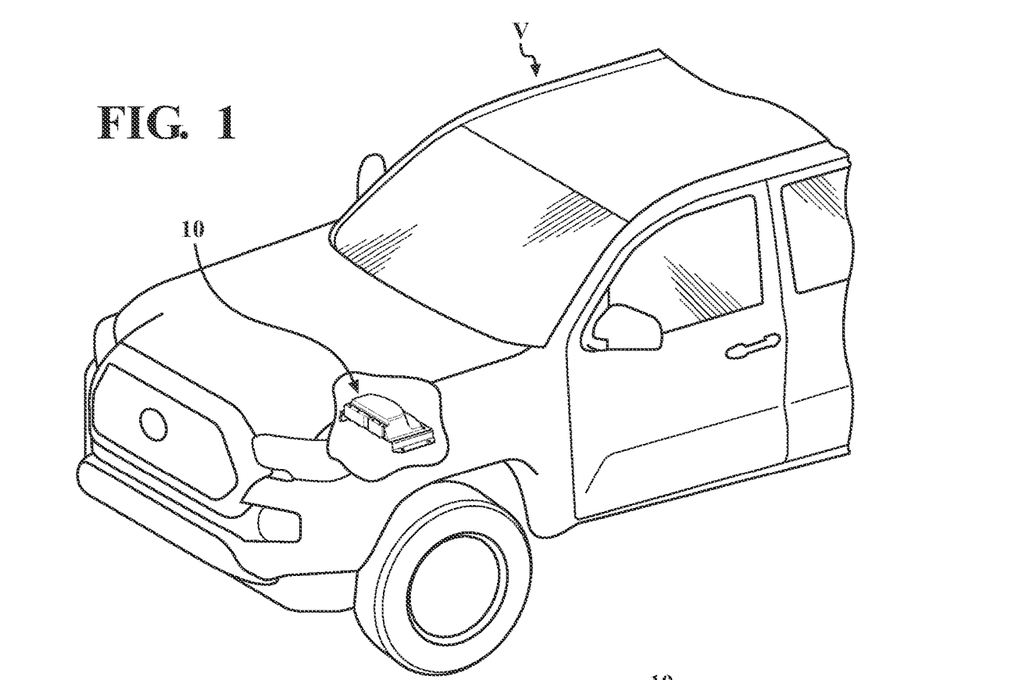
FIG. 1 is a perspective view of a vehicle with an electronic control unit (ECU)
Figure 2:
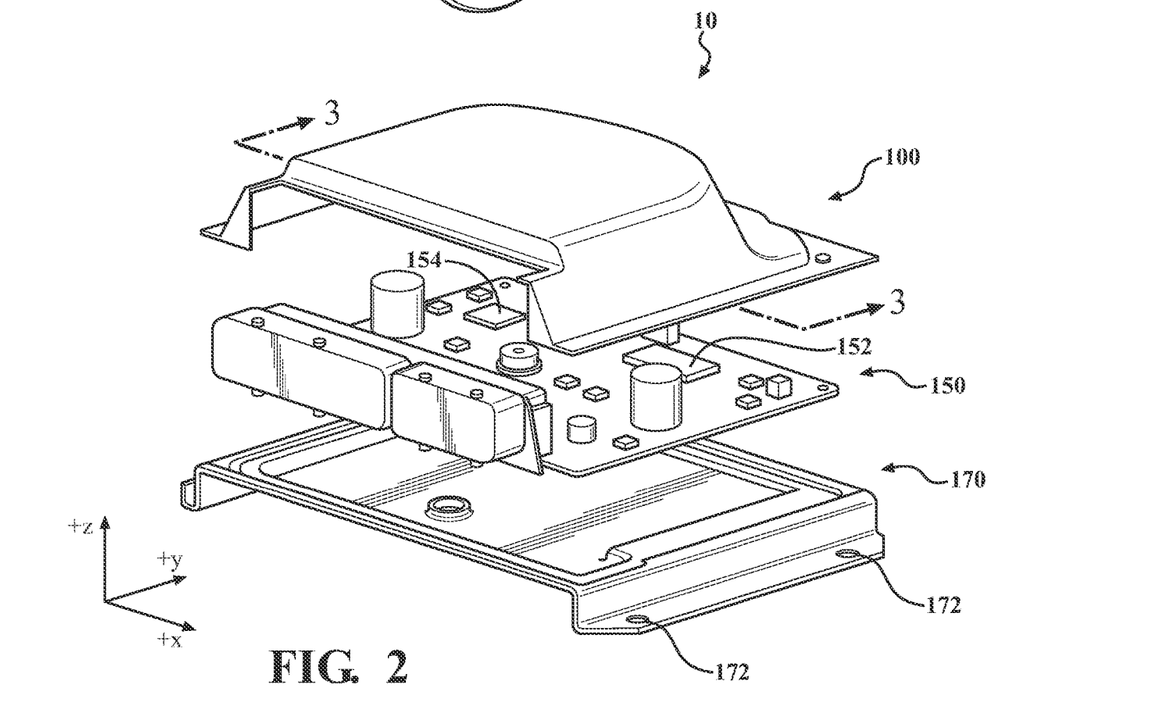
FIG. 2 is an exploded view of the ECU in FIG. 1 with an EMI shield and/or an ESD protection cover according to the teachings of the present disclosure.

Referring to FIGS. 1 and 2, a perspective view of a vehicle 'V' with an ECU 10 is shown in FIG. 1 and an exploded view of the ECU 10 is shown in FIG. 2. And while only one ECU 10 is shown in FIGS. 1 and 2, more than one ECU can be and is typically present in a vehicle. Non-limiting examples of ECUs that control or assist in control of various components of a vehicle include ECUs for engine control, cruise control, overhead console control, electronically adjustable steering wheel control, among others. It should also be understood that control of one or more vehicle components can be assigned to and executed by a single ECU. For example, an engine control unit ECU (also known as an engine control module (ECM)) can include input from a camshaft position sensor, a mass air flow sensor, a heated oxygen sensor, a manifold absolute pressure (MAP) sensor, an exhaust gas recirculation (EGR) sensor, a coolant temperature sensor, a throttle position sensor, a crankshaft position sensor, a vehicle speed sensor, and a knock sensor, among others.

Referring particularly to FIG. 2, the ECU 10 includes a housing 100 described in greater detail below, an electronic circuit board 150 (e.g., a printed circuit board (PCB)), and a base 170. The electronic circuit board 150 includes several of electronic components such as a core 152 (i.e., a microcontroller) and memory 154, among others, configured to receive sensor signal input and provide device signal output such that desired functioning of one or more vehicle devices is provided. The base 170 provides a platform or support structure for the electronic circuit board 150 to be mounted on. In addition, the base 170 can be mounted to another structure, e.g., using threaded fasteners (not shown) extending through apertures 172 of the base 170, such that the ECU 10 is securely mounted to the vehicle V. And while the housing 100 is shown in FIGS. 1 and 2 as a vehicle component housing, the housing 100 can be an electronic component housing for an ECU 10 not included with a vehicle.

Figure 3:
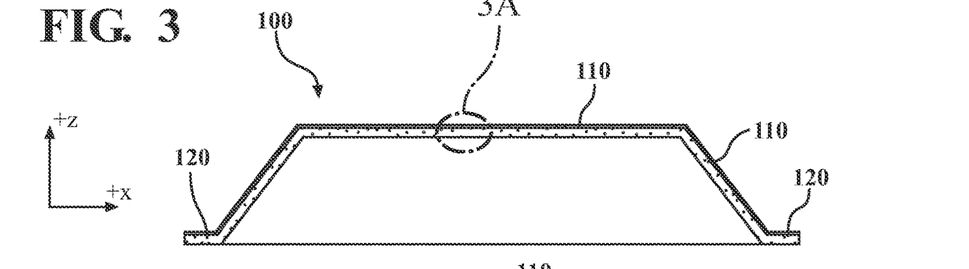
FIG. 3 is a cross-sectional view of section 3-3 in FIG. 2.
Figure 3A:
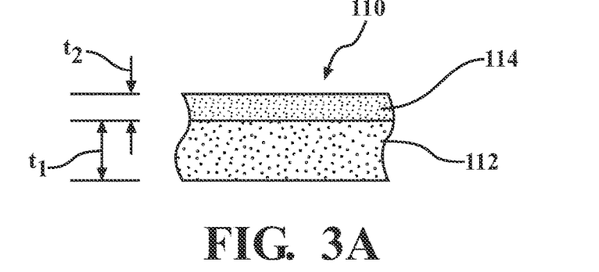
FIG. 3A is an enlarged view of section 3A in FIG. 3.

Referring to FIGS. 3 and 3A, a cross-sectional view of the housing 100 is shown in FIG. 3 and an enlarged view of section 3A in FIG. 3 is shown in FIG. 3A. In some variations, the housing 100 is formed from or includes one or more planar sections 110 and a flange 120. Also, the housing includes a polymeric core 112 and an overmolded outer layer 114. As used herein, the term "overmolded" refers to an injection molded layer formed on or "over" a previously formed layer, substrate, or core (which may or may not be injection molded), and the term "outer" refers to a surface or layer facing away from an electronic circuit board of an ECU contained or positioned at least partially within or between the housing 100 and the base 170. The polymeric core 112 is formed from a first polymeric material and the overmolded outer layer 114 is formed from a second polymeric material. The first polymeric material and the second polymeric material may or may not be the same polymeric material. In some variations, the first and/or second polymeric materials is at least one of a thermoplastic, a thermoset epoxy, and a phenolic polymer. For example, in some variations the first polymeric material and/or the second polymeric material are at least one of polypropylene (PP), polybutylene terephthalate (PBT), acrylonitrile butadiene styrene (ABS), and combinations thereof, among others. And in at least one variation of the present disclosure, the first polymeric material and the second polymeric material are polypropylene.

In some variations the polymeric core 112 is formed from the first polymeric material with additions of a reinforcement material that provides structural reinforcement to the housing 100. Non-limiting examples of the reinforcement material include glass (e.g., glass fibers and/or glass beads), talc, one or more mineral fillers (e.g., calcium carbonate, silica, wollastonite, clay, calcium sulfate fibers, mica, and alumina trihydrate), and combinations thereof.

In at least one variation, the overmolded outer layer 114 is formed from the second polymeric material with additions of graphene and/or carbon black. And in some variations the overmolded outer layer 114 is formed from the second polymeric material with between about between about 2 wt. % and 30 wt. % graphene. In such variations, the overmolded outer layer 114 defines a housing skin that provides EMI shielding and/or ESD protection to the electronic circuit board 150. That is, the polymeric core 112 and the overmolded outer layer 114 define an EMI shield and/or an ESD protection cover.

The polymeric core 112 has a first thickness 't1' and the overmolded outer layer 114 has a second thickness 't2'. In some variations, the polymeric core 112 has a first thickness t1 between about 1 millimeter (mm) and about 10 mm, and in at least one variation the first thickness t1 is between about 2 mm and about 5 mm. Also, in some variations, the overmolded outer layer 114 has a second thickness t2 between about 0.5 mm and about 5 mm, and in at least one variation the second thickness t2 is between about 1 mm and about 2.5 mm.

As noted above, in some variations the polymeric core 112 and the overmolded outer layer 114, i.e., the housing 100, define an EMI shield that reflects and/or absorbs EM radiation. In such variations, the housing 100 has a shielding efficiency of at least 30 decibels (dB) for EM radiation frequencies between about 1 kHz and about 100 GHz. For example, in at least one variation the housing 100 has a shielding efficiency of at least 35 dB for EM radiation frequencies between about 1 kHz and about 100 GHz, and in some variations the housing 100 has a shielding efficiency between about 40 dB and about 60 dB for EM radiation frequencies between about 1 kHz and about 100 GHz. It should be understood that the shielding efficiency refers to the level of attenuation provided by the housing 100 and attenuation (in dB) refers to the ratio between EM field strength with and without the presence of the housing 100 as measured with a coaxial transmission line test and/or a shielded box test.

As also noted above, in some variations the polymeric core 112 and the overmolded outer layer 114, i.e., the housing 100, define an ESD protection cover that dissipates static electricity. In such variations, the housing 100 has an anti-static conductivity greater than about $10^{-10}$ S/m and/or a static dissipative conductivity greater than about $10^{-8}$ S/m. For example, in at least one variation the housing 100 has an anti-static conductivity greater than about $10^{-9}$ S/m and less than or equal to about $10^{-6}$ S/m and/or a static dissipative conductivity greater than about $10^{-7}$ S/m and less than or equal to about $10^{-3}$ S/m.

In some variations, the housing 100 defines an EMI shield with the overmolded layer 114 formed from the second polymeric material with between about 12.5 wt. % and about 30 wt. % graphene, for example, between about 15 wt. % and about 30 wt. % graphene. In at least one variation, the housing 100 defines an ESD protection cover configured for static electricity dissipation with the overmolded layer 114 formed from the second polymeric material with between about 5 wt. % and about 17.5 wt. % graphene, for example, between about 5 wt. % and about 15 wt. % graphene. And in some variations, the housing 100 defines an ESD protection cover configured for anti-static conduction with the overmolded layer 114 formed from the second polymeric material with between about 2 wt. % and about 12.5 wt. % graphene, for example, between about 2 wt. % and about 10 wt. % graphene.

Figure 4A:
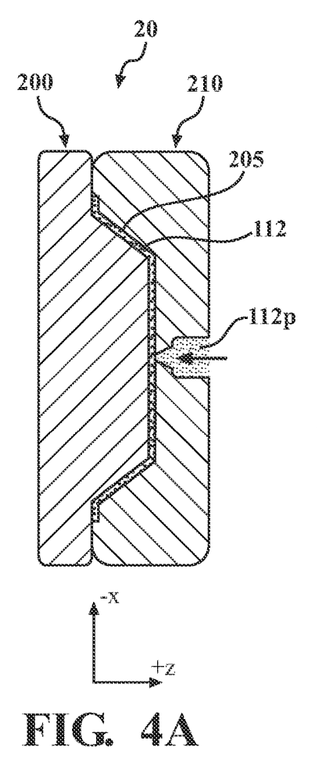
FIG. 4A is a cross-sectional view of a polymeric core of an ECU housing being formed in a first mold set according to the teachings of the present disclosure.
Figure 4B:
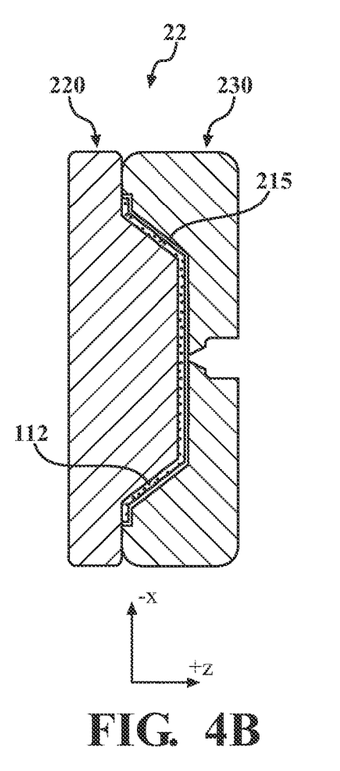
FIG. 4B is a cross-sectional view of the polymeric core in FIG. 4A positioned in a second mold set according to the teachings of the present disclosure.
Figure 4C:
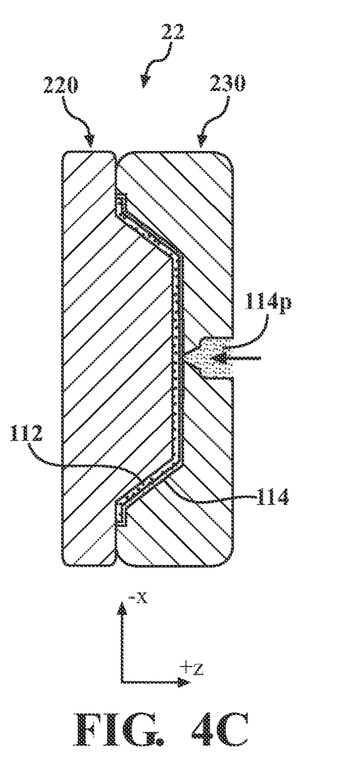
FIG. 4C is a cross-sectional view of an overmolded outer layer being formed on the polymeric core in the second mold set according to the teachings of the present disclosure.

Referring now to FIGS. 4A-4C, forming the housing 100 using an overmolding process according to one form of the present disclosure is shown. Particularly, and with reference to FIG. 4A, the polymeric core 112 is formed by injecting a first polymeric material with reinforcement material 112p (i.e., a mechanical mixture of a first polymeric material and reinforcement material) into a mold cavity 205 defined between a first mold die 200 and a second mold die 210 of a first mold set 20. The polymeric core 112 is removed from the mold cavity 205 and placed within another mold cavity 215 defined between another first mold die 220 and another second mold die 230 of a second mold set 22 as shown in FIG. 4B, and a second polymeric material with graphene and/or carbon black 114p (i.e., a mechanical mixture of a second polymeric material with graphene and/or carbon black) is injected molded into the mold cavity 215 to form the overmolded outer layer 114 as shown in FIG. 4C. In some variations the first mold die 220 is the same mold die as the first mold die 200, while in other variations the first mold die 220 is a different mold die than the first mold die 200.

Figure 5:
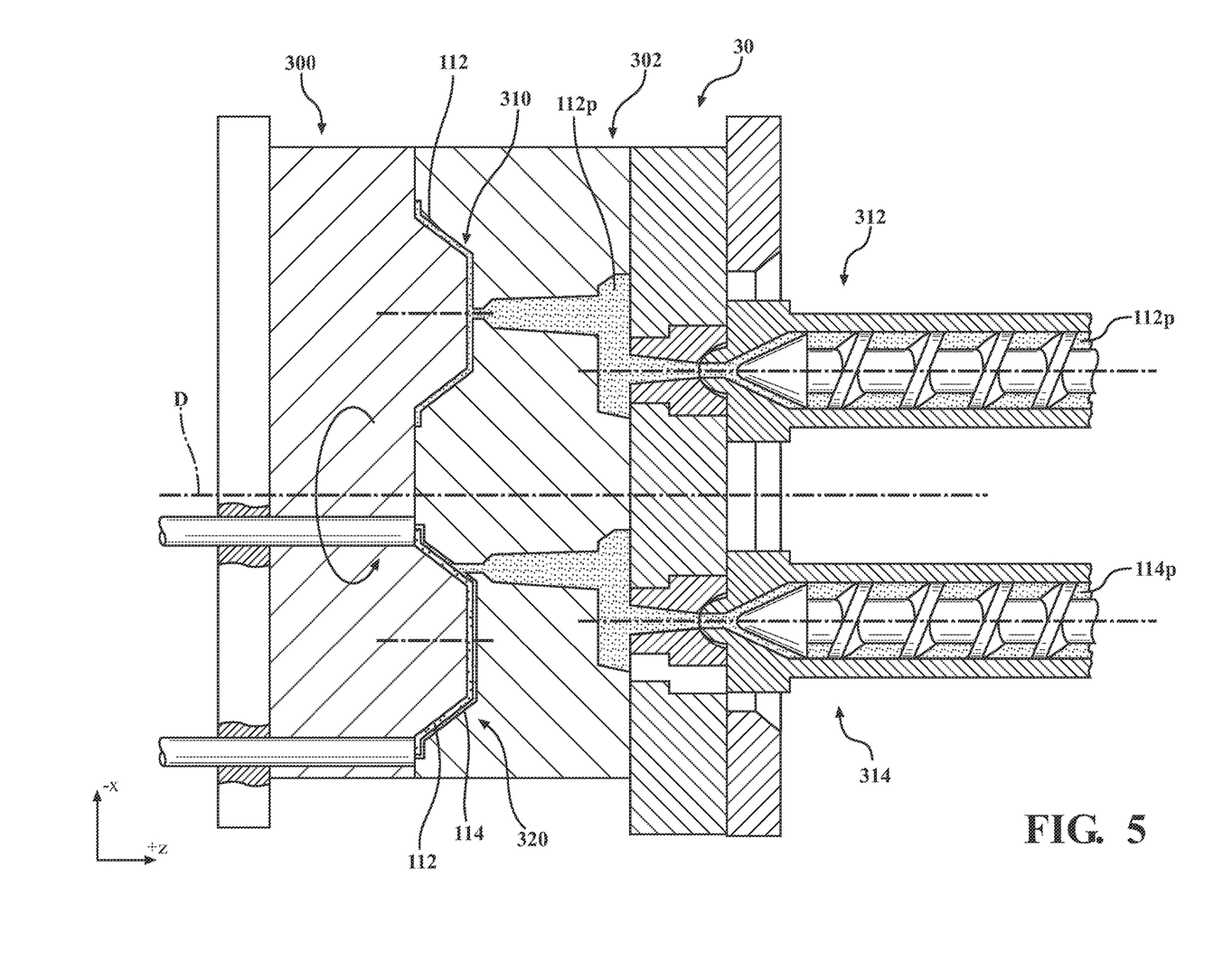
FIG. 5 is a cross-sectional view of an ECU housing for EMI shielding and/or ESD protection being formed with a two-shot injection molding process according to the teachings of the present disclosure.

Referring to FIG. 5, forming the housing 100 using a two-shot injection molding process or machine 30 according to another form of the present disclosure is shown. The two-shot injection molding machine 30 includes a rotatable first mold die 300, a second mold die 302 with a first mold cavity 310 and a second mold cavity 320, a first injection unit 312, and a second injection unit 314. The first injection unit 312 injects the first polymeric material with reinforcement material 112p into the first mold cavity 310 and forms the polymeric core 112. Then the rotatable first mold die 300 with the polymeric core 112 rotates about a die axis 'D' such that the polymeric core 112 is positioned within the second mold cavity 320. The second injection unit 314 injects the second polymeric material with graphene 114p into the second mold cavity and forms the overmolded outer layer 114 onto the polymeric core 112, and the first injection unit 312 injects the first polymeric material with reinforcement material 112p into the first mold cavity 310 and forms another polymeric core 112. After the two-shot injection molded outer layer 114 is formed, i.e., after the housing 100 is formed, the rotatable first mold die 300 and the second mold die 302 are separated from each other (x-direction), the housing 100 is pushed (removed) off of the rotatable first mold die 300, and the rotatable first mold die 300 rotates about the die axis D such that the another polymeric core 112 is positioned within the second mold cavity 320. This cycle, i.e., forming of a polymeric core 112 in the first mold cavity 310, forming of the overmolded outer layer 114 onto a polymeric core 112 in the second mold cavity, removing the housing 100 from the rotatable first mold die 300, and rotating the rotatable first mold die 300, continues such that a plurality of housings 100 are formed.

Figure 6:
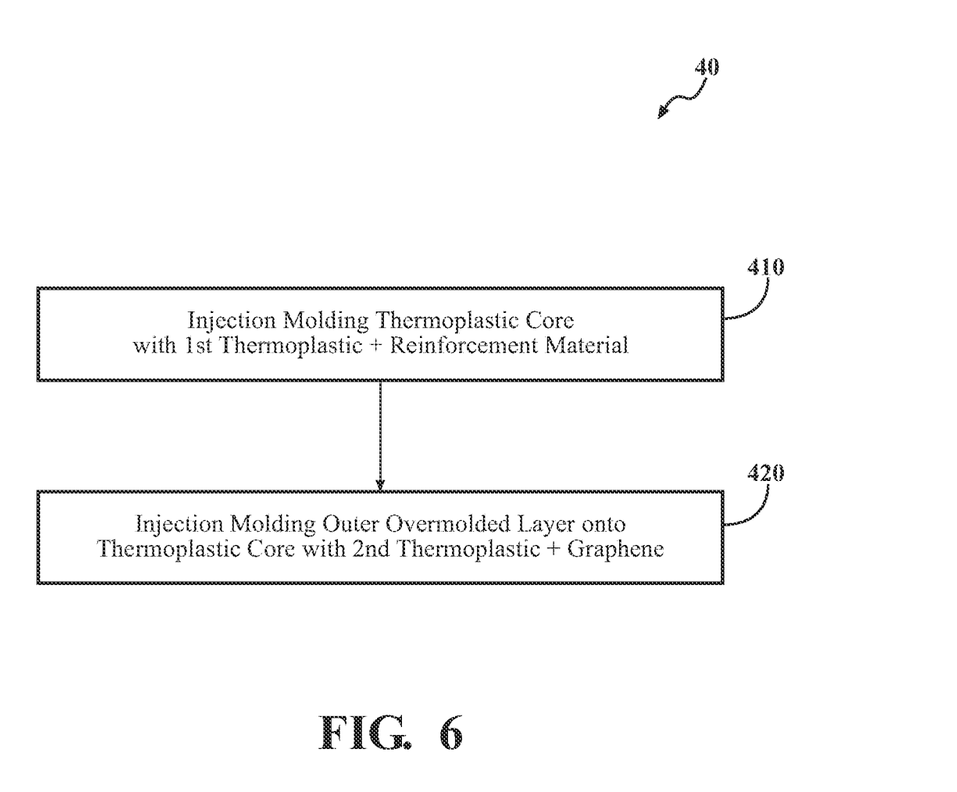
FIG. 6 is a flow chart for a method of making an ECU housing for EMI shielding and/or an ESD protection according to the teachings of the present disclosure.

Referring to FIG. 6, a flow chart for a method 40 of forming the housing 100 is shown. The method 40 includes injection molding the first polymeric material with reinforcement material 112p and forming a polymeric core 112 at 410 and injection molding the second polymeric material with graphene 114p and forming the overmolded outer layer 114 on the polymeric core 112 at 420. The first polymeric material with reinforcement material 112p can be a mixture of thermoplastic pellets and thermoplastic with reinforcement material pellets fed into a first hopper and a barrel of a first injection unit such that the first polymeric material with reinforcement material 112p has a desired reinforcement material content before being injection molded to form the polymeric core 112. Also, the second polymeric material with graphene 114p can be a mixture of thermoplastic pellets and thermoplastic with graphene pellets fed into a second hopper and a barrel of a second injection unit such that the second polymeric material with graphene 114p has a desired graphene content before being injection molded to form the overmolded outer layer 114.

While FIGS. 3-5 show only the housing 100 being formed by injection molding a polymeric core and an overmolded outer layer onto the polymeric core, in some variations the base 170 is formed in a similar manner. That is, in some variations the base 170 defines an EMI shield with a polymeric core formed from a first polymeric material with reinforcement material and an overmolded outer layer formed from a second polymeric material with graphene.

In view of the teachings of the present disclosure, the housing 100 with the polymeric core 112 and the overmolded outer layer 114 (i.e., housing skin) provides an EMI shield without one or more limitations of traditional EMI shields. For example, injection molding of the first polymeric material with reinforcement material 112p and the second polymeric material with graphene 114p provides for an EMI shield and/or an ESD protection cover with reduced weight and increased design flexibility compared to metallic housings and reduced EHS and waste disposal limitations compared to polymer housings with electro-less metal, electro-plated metal, and/or metallization coatings. In addition, the housing 100 does not have coating adhesion limitations as with polymer housings with conductive spray coatings since the graphene is disposed within the second polymeric material that forms the overmolded outer layer 114 and not present as a coating on the polymeric core 112.

The preceding description is merely illustrative in nature and is in no way intended to limit the disclosure, its application, or uses. As used herein, the phrase at least one of A, B, and C should be construed to mean a logical (A or B or C), using a non-exclusive logical "or." The various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for general organization of topics within the present disclosure and are not intended to limit the disclosure of the technology or any aspect thereof. The recitation of multiple embodiments having stated features is not intended to exclude other embodiments having additional features, or other embodiments incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

As used herein, the terms "comprise," "include," and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

The foregoing description of the embodiments has been provided for purposes of illustration and description. It is not intended to be exhaustive or to limit the disclosure. Individual elements or features of an embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

What is claimed is:

1. An electronic component housing comprising:
    an injection molded polymeric core comprising a first polymeric material; and
    an injection molded overmolded outer layer comprising a second polymeric material with graphene, wherein the injection molded overmolded outer layer defines a housing skin disposed on the injection molded polymeric core, the injection molded polymeric core and the injection molded overmolded outer layer defining an electrostatic discharge (ESD) protection cover with an anti-static conductivity greater than about $10^{-10}$ S/m and a static dissipative conductivity greater than about $10^{-8}$ S/m.

2. The electronic component housing according to claim 1, wherein the injection molded polymeric core is free of graphene.

3. The electronic component housing according to claim 1, wherein the injection molded polymeric core includes a reinforcement material, wherein the reinforcement material provides structural reinforcement to the electronic component housing and is at least one of carbon fiber, glass, talc, mineral filler, and combinations thereof.

4. The electronic component housing according to claim 1, wherein the first polymeric material and the second polymeric material are at least one of a thermoplastic, a thermoset epoxy, and a phenolic polymer.

5. The electronic component housing according to claim 1, wherein the first polymeric material and the second polymeric material are at least one of polypropylene, polybutylene terephthalate, acrylonitrile butadiene styrene, and combinations thereof.

6. The electronic component housing according to claim 1, wherein the first polymeric material and the second polymeric material are the same polymeric material.

7. The electronic component housing according to claim 1, wherein the first polymeric material and the second polymeric material are polypropylene.

8. The electronic component housing according to claim 1, wherein the overmolded outer layer comprises the second polymeric material with between about 2 wt. % and about 30 wt. % graphene.

9. The electronic component housing according to claim 1, wherein the injection molded polymeric core and the injected molded overmolded outer layer define an EMI shield with a shielding efficiency of at least 30 dB for EM radiation frequencies between about 1 GHz to about 40 GHz.

10. The electronic component housing according to claim 9, wherein the shielding efficiency is at least 35 dB for EM radiation frequencies between about 1 GHz to about 40 GHz.

11. The electronic component housing according to claim 9, wherein the shielding efficiency is between about 35 dB and about 90 dB for EM radiation frequencies between about 1 GHz to about 100 GHz.

12. The electronic component housing according to claim 1, wherein the anti-static conductivity is greater than about $10^{-9}$ S/m and less than or equal to about $10^{-6}$ S/m and the static dissipative conductivity is greater than about $10^{-7}$ S/m and less than or equal to about $10^{-3}$ S/m.

13. The electronic component housing according to claim 1, wherein the injection molded polymeric core has a thickness between about 1 mm and about 10 mm.

14. The electronic component housing according to claim 1, wherein the injection molded overmolded outer layer has a thickness between about 0.5 mm and about 5 mm.

15. An electronic component housing defining an EMI shield and an ESD protection cover, the electronic component housing comprising:
   a polymeric core comprising a first polymeric material with a reinforcement material, wherein the reinforcement material provides structural reinforcement to the electronic component housing and is at least one of carbon fiber, glass, talc, mineral filler, and combinations thereof; and
   an overmolded outer layer comprising a second polymeric material and between about 2 wt. % and about 30 wt. % graphene, wherein the overmolded outer layer defines a housing skin disposed on the polymeric core, wherein the polymeric core and the overmolded outer layer define an electrostatic discharge (ESD) protection cover with an anti-static conductivity greater than about $10^{-10}$ S/m and a static dissipative conductivity greater than about $10^{-8}$ S/m.

16. The electronic component housing according to claim 15, wherein the first polymeric material and the second polymeric material are at least one of a thermoplastic, a thermoset epoxy, and a phenolic polymer.

17. The electronic component housing according to claim 16, wherein:
   the polymeric core has a thickness between about 1 mm and about 10 mm;
   the housing skin has a thickness between about 0.5 mm and about 5 mm;
   the polymeric core with the housing skin has a shielding efficiency between about 35 dB and about 90 dB for EM radiation frequencies between about 1 GHz to about 100 GHz; and
   the polymeric core with the housing skin has an anti-static conductivity less than or equal to about $10^{-6}$ S/m and a static dissipative conductivity less than or equal to about $10^{-3}$ S/m.

18. An electronic component housing comprising:
   an injection molded polymeric core comprising a first polymeric material; and
   an injection molded overmolded outer layer comprising a second polymeric material with graphene, wherein the injection molded overmolded outer layer defines a housing skin disposed on the injection molded polymeric core, the injection molded polymeric core and the injection molded overmolded outer layer defining an electrostatic discharge (ESD) protection cover with an anti-static conductivity greater than about $10^{-9}$ S/m and less than or equal to about $10^{-6}$ S/m and a static dissipative conductivity greater than about $10^{-7}$ S/m and less than or equal to about $10^{-3}$ S/m.

19. The electronic component housing according to claim 18, wherein the injection molded polymeric core is free of graphene.

20. The electronic component housing according to claim 18, wherein the injection molded polymeric core includes a reinforcement material, wherein the reinforcement material provides structural reinforcement to the electronic component housing and is at least one of carbon fiber, glass, talc, mineral filler, and combinations thereof.

* * * * *